United States Patent
Demachi

(10) Patent No.: US 10,693,318 B2
(45) Date of Patent: Jun. 23, 2020

(54) ENERGY MANAGEMENT SYSTEM, ENERGY MANAGEMENT METHOD, AND PROGRAM

(71) Applicant: YOKOGAWA ELECTRIC CORPORATION, Tokyo (JP)

(72) Inventor: Koji Demachi, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 527 days.

(21) Appl. No.: 15/303,839

(22) PCT Filed: Mar. 24, 2015

(86) PCT No.: PCT/JP2015/058800
§ 371 (c)(1),
(2) Date: Apr. 28, 2017

(87) PCT Pub. No.: WO2015/159652
PCT Pub. Date: Oct. 22, 2015

(65) Prior Publication Data
US 2017/0256986 A1 Sep. 7, 2017

(30) Foreign Application Priority Data

Apr. 15, 2014 (JP) ................. 2014-083677

(51) Int. Cl.
| | |
|---|---|
| H02J 13/00 | (2006.01) |
| G05B 23/02 | (2006.01) |
| G05B 19/418 | (2006.01) |
| G06F 30/20 | (2020.01) |
| G05B 15/02 | (2006.01) |

(52) U.S. Cl.
CPC .......... *H02J 13/0062* (2013.01); *G05B 15/02* (2013.01); *G05B 19/418* (2013.01);
(Continued)

(58) Field of Classification Search
CPC ... H02J 13/0062; G05B 15/02; G05B 19/418; G05B 23/02; G06F 17/5009; Y02P 80/10;
(Continued)

(56) References Cited

U.S. PATENT DOCUMENTS 8,055,475 B1 * 11/2011 Hooper .............. G05B 23/0275
702/115
2002/0010563 A1 * 1/2002 Ratteree ................. G06Q 10/06
703/2
(Continued)

FOREIGN PATENT DOCUMENTS

| | | |
|---|---|---|
| JP | 08-076821 A | 3/1996 |
| JP | 2010-271826 A | 12/2010 |

(Continued)

*Primary Examiner* — James J Lee
*Assistant Examiner* — Michael W Choi
(74) *Attorney, Agent, or Firm* — Sughrue Mion, PLLC

(57) ABSTRACT

An energy management system, provided with: a collector that collects information regarding energy efficiency of a production apparatus and a processor that performs at least one of monitoring, simulation, and optimization of energy efficiency in production activity performed by the production apparatus, on the basis of the information regarding energy efficiency collected by the collector, using a modeling unit in which information regarding energy efficiency of a constituent element of the production apparatus is modeled on the basis of a predefined rule.

7 Claims, 9 Drawing Sheets

(52) U.S. Cl.
CPC ............. *G05B 23/02* (2013.01); *G06F 30/20* (2020.01); *Y02E 60/74* (2013.01); *Y02E 60/76* (2013.01); *Y02P 80/10* (2015.11); *Y02P 80/114* (2015.11); *Y02P 90/02* (2015.11); *Y04S 10/30* (2013.01); *Y04S 40/22* (2013.01)

(58) Field of Classification Search
CPC ........ Y02P 80/114; Y02P 90/02; Y02E 60/74; Y02E 60/76; Y04S 10/30; Y04S 40/22
USPC .......................................... 700/291
See application file for complete search history.

(56) References Cited

U.S. PATENT DOCUMENTS

| | | | | |
|---|---|---|---|---|
| 2004/0260421 | A1* | 12/2004 | Persson | G05B 13/048 700/128 |
| 2010/0036693 | A1* | 2/2010 | Probst | G06Q 10/00 705/7.25 |
| 2010/0228364 | A1 | 9/2010 | Ohashi et al. | |
| 2010/0274367 | A1* | 10/2010 | Kaufman | G05B 17/02 700/31 |
| 2014/0189416 | A1* | 7/2014 | Tajima | G06F 9/4887 713/600 |
| 2015/0120073 | A1* | 4/2015 | Ghosh | G06Q 50/06 700/291 |
| 2015/0120269 | A1* | 4/2015 | Dannecker | G06F 17/5009 703/18 |
| 2015/0127179 | A1* | 5/2015 | Binding | H02J 3/28 700/291 |

FOREIGN PATENT DOCUMENTS

| | | |
|---|---|---|
| JP | 4747756 B2 | 8/2011 |
| JP | 2011-248614 A | 12/2011 |
| JP | 2012-031799 A | 2/2012 |
| JP | 5029632 B2 | 9/2012 |

* cited by examiner

FIG. 6

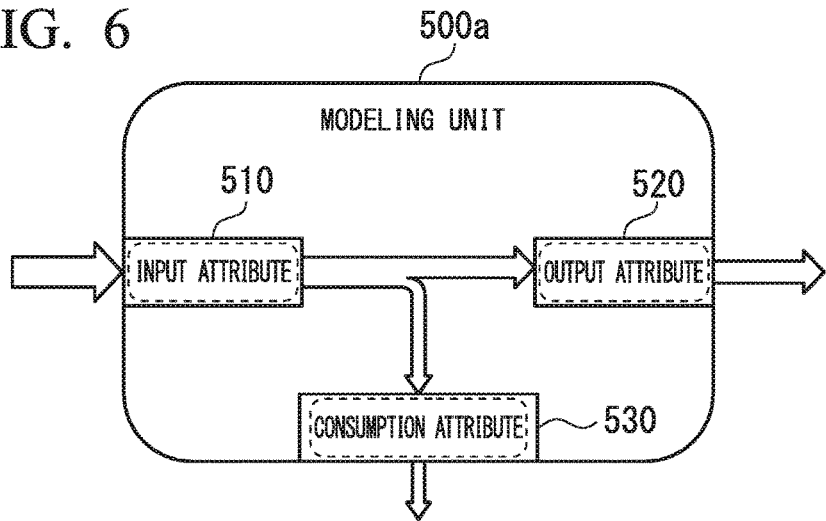

FIG. 7

| INPUT ATTRIBUTE | INFORMATION INDICATING TYPE OF FLOW | INFORMATION INDICATING AMOUNT OF FLOW |
| OUTPUT ATTRIBUTE | INFORMATION INDICATING TYPE OF FLOW | INFORMATION INDICATING AMOUNT OF FLOW |
| CONSUMPTION ATTRIBUTE | INFORMATION INDICATING TYPE OF FLOW | INFORMATION INDICATING AMOUNT OF FLOW |

FIG. 8

| INPUT ATTRIBUTE | INFORMATION INDICATING TYPE OF FLOW | INFORMATION INDICATING AMOUNT OF FLOW | |
|---|---|---|---|
| | | TIME PERIOD-1 | FLOW RATE-1 |
| | | TIME PERIOD-2 | FLOW RATE-2 |
| | | TIME PERIOD-3 | FLOW RATE-3 |
| | | ⋮ | ⋮ |
| ⋮ | ⋮ | ⋮ | |

ENERGY MANAGEMENT SYSTEM, ENERGY MANAGEMENT METHOD, AND PROGRAM

TECHNICAL FIELD

The present invention relates to an energy management system, an energy management method, and a program.

BACKGROUND ART

As one of the means which includes a great effect of improving energy efficiency during operation of a plant (production apparatus), the plant and an automation system are designed to achieve the maximum energy efficiency prior to construction of the plant. Simulation using a virtual plant model is performed to optimize the design for energy efficiency.

As a technique related to an energy related system, Patent Document 1 discloses an energy management system including a data holder for collecting and preserving "energy consumption data" in "data related to energy efficiency". Patent Document 2 discloses an energy monitoring system having a function of collecting data from a power monitor and grouping the data. Patent Document 3 discloses a plant information management apparatus which manages a data group related to a plant in correlation with a "unit".

CITATION LIST

[Patent Document 1] Japanese Unexamined Patent Application, First Publication No. 2010-271826
[Patent Document 2] Japanese Patent No. 4747756
[Patent Document 3] Japanese Patent No. 5029632

DISCLOSURE OF THE INVENTION

Problems to be Solved by the Invention

Since most of such plants are formed of various kinds of elements having complex structures and delivered from a plurality of manufacturers, it may not be easy to perform flexible simulation of complex and diverse plants.

For example, in the technique disclosed in Patent Document 1, "energy input information", "energy output information", and the like are not mentioned except for the "energy consumption data", and thus it is not easy to cope with complex and diverse plants. In the technique disclosed in Patent Document 2, data collected from the power monitor is grouped, and thus adding or changing of a power monitor is facilitated, but it is not easy to cope with complex and diverse plants if data is only collected from the power monitor. In the technique disclosed in Patent Document 3, a data group related to a plant is managed in correlation with a "unit", but this "unit" is restricted to being used to present data, and thus it is not easy to perform monitoring, simulation, or optimization of energy efficiency to cope with complex and diverse plants.

An aspect of the present invention is to provide an energy management system, an energy management method, and a program capable of performing at least one of monitoring, simulation, or optimization of energy efficiency so as to cope with complex and diverse plants (production apparatuses).

Means for Solving the Problems (1) An energy management system of one aspect of the invention may include a collector that collects information regarding energy efficiency of a production apparatus and a processing section that performs at least one of monitoring, simulation, and optimization of energy efficiency in production activity performed by the production apparatus, on the basis of the information regarding energy efficiency collected by the collector, using a modeling unit in which information regarding energy efficiency of a constituent element of the production apparatus is modeled on the basis of a predefined rule.

(2) Above stated energy management system may further include the processor performs at least one of monitoring, simulation, and optimization of energy efficiency in production activity performed by the production apparatus, on the basis of the information regarding energy efficiency collected by the collector, using the modeling unit obtained through hierarchical modeling.

(3) In the above stated energy management system, the modeling unit is obtained by modeling information regarding one selected from the group consisting of a structure, a function, and performance related to energy efficiency of a specific constituent element of the production apparatus on the basis of a predefined rule.

(4) In the above stated energy management system, the modeling unit includes, as attributes indicating a feature or a state of the modeling unit, one selected from the group consisting of an input attribute relating to input to the modeling unit, an output attribute related to output from the modeling unit, and a consumption attribute related to consumption between input to and output from the modeling unit.

(5) In the above stated energy management system, the modeling unit includes, as the attributes indicating the feature and the state of the modeling unit, one selected from the group consisting of an attribute group including an input attribute, an output attribute, and a consumption attribute related to a substance flow, and one selected from the group consisting of an attribute group including an input attribute, an output attribute, and a consumption attribute related to an energy flow.

(6) In the above stated energy management system, the modeling unit further includes, as the attributes indicating the feature and the state of the modeling unit, an accumulation attribute including information indicating an accumulation amount representing a difference between an inflow amount to the modeling unit and an outflow amount from the modeling unit.

(7) In the above stated energy management system, the modeling unit includes, as the attributes indicating the feature and the state of the modeling unit, an accumulation attribute related to a substance flow, including information indicating an accumulation amount of substance related to a difference between an inflow amount of substance which is input to the modeling unit and an outflow amount of substance which is output from the modeling unit, and an accumulation attribute related to an energy flow, including information indicating an accumulation amount of energy representing a difference between an inflow amount of energy which is input to the modeling unit and an outflow amount of energy which is output from the modeling unit.

(8) In the above stated energy management system, the attributes of the modeling unit include information in which information indicating the type of flow is associated with information indicating an amount of the flow for each type of flow of a target which is input to the modeling unit.

(9) In the above stated energy management system, in a case where a target which is input to the modeling unit is energy, the attribute related to an energy flow of the modeling unit includes information indicating one or more of the group consisting of electrical energy, thermal energy, potential energy, and kinetic energy, as the information indicating the type of flow.

(10) In the above stated energy management system, the attributes of the modeling unit includes information indicating an amount of the flow per unit time as the information indicating an amount of the flow.

(11) In the above stated energy management system, the modeling unit includes: an input device obtained by modeling a portion which is input to the production apparatus; an output device obtained by modeling a portion which is output from the production apparatus; and a consumption component obtained by modeling a portion consumed between input to and output from the production apparatus.

(12) In the above stated energy management system, the attributes of the modeling unit include information in which information indicating the type of flow is associated with information indicating an amount of the flow for each type of flow of a target which is input to the modeling unit.

The processor performs at least one of monitoring, simulation, and optimization of energy efficiency in production activity performed by the production apparatus, on the basis of the information regarding energy efficiency collected by the collector, using a plurality of the modeling units which are combined with each other by connecting the output device of a first modeling unit to the input device of a second modeling unit having the input attribute including the same type of the flow as a type of the flow of the output attribute of the output device.

(13) In the above stated energy management system, the plurality of combined modeling units are collected into a single modeling unit as a higher-rank modeling unit.

One selected from the group consisting of the input device, the output device, and the consumption component which is not connected between the plurality of combined modeling units in the higher-rank modeling unit is connected to one selected from the group consisting of the input device, the output device, and the consumption component of the higher-rank modeling unit.

The input attribute, the output attribute, and the consumption attribute respectively corresponding to the input device, the output device, the consumption component of the higher-rank modeling unit are used as the input attribute, the output attribute, and the consumption attribute respectively corresponding to the input device, the output device, the consumption component connected thereto.

(14) In the above stated energy management system, in a case where there are one or more of the group consisting of a plurality of input devices, a plurality of output devices, and a plurality of consumption components which are not connected between the plurality of combined modeling units in the higher-rank modeling unit, attributes respectively corresponding to one or more selected from the group consisting of the plurality of input devices, the plurality of output devices, and the plurality of consumption components, are collected and are used as attributes of the higher-rank modeling unit.

(15) In the above stated energy management system, in a case where a target which is input to the modeling unit is a substance, the attributes related to a substance flow of the modeling unit include information regarding unit apparent energy indicating an energy per unit amount corresponding to a type of the substance.

The processor sets the unit apparent energy included in an input attribute related to a substance flow of the modeling unit to a value of the unit apparent energy included in an output attribute related to a substance flow of a modeling unit which is combined on an upstream side or to a predefined value of the unit apparent energy, and calculates a value of the unit apparent energy included in an output attribute related to a substance flow of the modeling unit on the basis of the input attribute related to a substance flow of the modeling unit, an input attribute related to an energy flow, and an output attribute related to an energy flow.

Effects of the Invention

According to the aspects of the present invention, it is possible to perform at least one of monitoring, simulation, or optimization of energy efficiency to cope with complex and diverse plants (production apparatuses).

BRIEF DESCRIPTION OF THE DRAWINGS

FIG. 6 is a diagram showing a first example of a configuration of a modeling unit of the present invention.

FIG. 7 is a diagram showing an example of information included in an attribute of the modeling unit of the present invention.

FIG. 8 is a diagram showing an example of information indicating an amount of flow included in the attribute of the modeling unit of the present invention.

MODE FOR CARRYING OUT THE INVENTION

Hereinafter, with reference to the drawings, embodiments of the present invention will be described.

<Schematic Configuration of Energy Management System 1>

Figure 1:
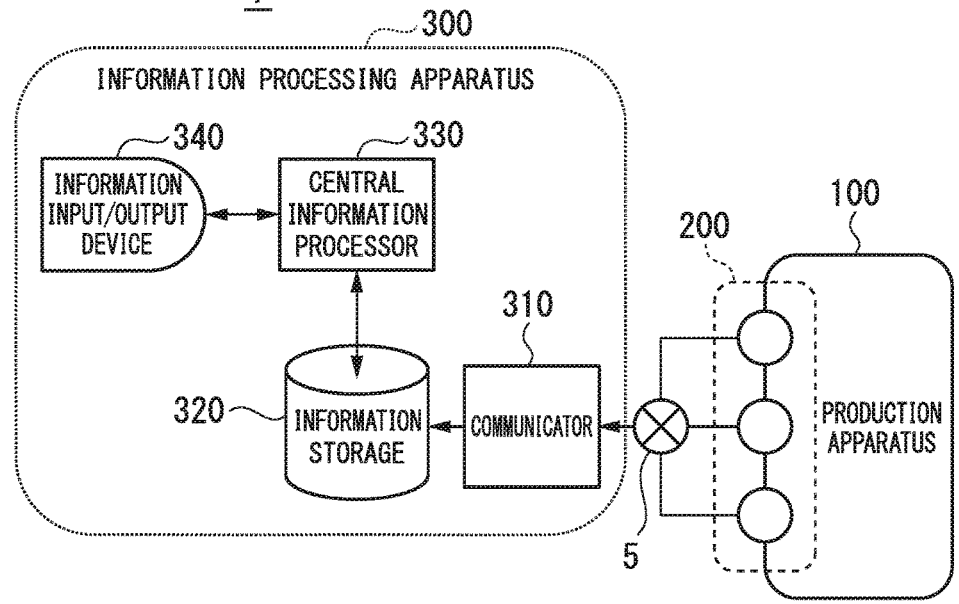
FIG. 1 is a configuration diagram showing an example of a schematic configuration of an energy management system according to an embodiment of the present invention.

FIG. 1 is a configuration diagram showing an example of a schematic configuration of an energy management system 1 according to an embodiment of the present invention. The energy management system 1 includes a means (collector) for collecting data related to energy efficiency of a production apparatus 100 (plant); a means (holder) for holding the data; and a means (analyzer) for analyzing the data, and realizes a function including at least one of monitoring, simulation, and optimization of energy efficiency during production.

In the example shown in FIG. 1, the energy management system 1 includes a sensor group 200 for measuring elements related to energy efficiency of the production apparatus 100, such as a state of the production apparatus 100 as a management target or an energy flow, an information processing apparatus 300 which processes information related to the production apparatus 100, obtained from the sensor group 200, and a communication network 5 which connects the sensor group 200 to the information processing apparatus 300.

The production apparatus 100 is, for example, an industrial plant such as a chemical plant, a plant which manages and controls a well site such as a gas field or an oil field, or the periphery thereof, a plant which manages and controls generation of power such as a hydraulic power plant, a thermal power plant, and a nuclear power plant, a plant which manages and controls environmental power generation such as solar generator or a wind turbine, or a plant which manages and controls water and sewerage or controls a dam.

The sensor group 200 includes a plurality of field apparatuses such as measurement apparatuses provided in the production apparatus 100 or movable measurement apparatuses. The field apparatuses may employ, for example, a sensor apparatus such as a flowmeter or a temperature sensor, a valve apparatus such as a flow control valve or a switch valve, an actuator apparatus such as a fan or a motor, an imaging apparatus such as a camera or a video camera imaging a situation in the plant or a target object, an acoustic apparatus such as a microphone collecting abnormal noise or a speaker generating an alarming sound, a position detection apparatus which outputs position information of each apparatus, and other apparatuses.

The communication network 5 is a communication network based on a current signal of 4 to 20 mA, a digital signal superimposed on the current signal, a digital signal in field bus communication or the like, or industrial wireless communication such as ISA100.11a or Wireless HART (registered trademark).

The information processing apparatus 300 includes a communicator 310, an information storage 320, a central information processor 330, and an information input/output device 340.

The communicator 310 (collector) acquires information from the sensor group 200 via the communication network 5. For example, the communicator 310 collects information regarding energy efficiency of the production apparatus 100, detected by the sensor group 200, from the sensor group 200.

The information storage 320 is configured using a recorder such as a random access memory (RAM), an electrically erasable programmable read-only memory (EEPROM), a flash ROM, or a hard disk drive (HDD), or a combination thereof, and stores the information collected by the communicator 310.

The central information processor 330 (processor) analyzes and processes the information collected by the communicator 310. For example, the central information processor 330 performs at least one of monitoring, simulation, and optimization of energy efficiency during production performed by the production apparatus 100, on the basis of the information collected by the communicator 310, using a modeling unit in which information regarding energy efficiency of a specific constituent element of the production apparatus 100 is modeled on the basis of a predefined rule. For example, the central information processor 330 uses a modeling unit in which information regarding a structure, a function, and performance related to the energy efficiency of the specific constituent element of the production apparatus 100 is modeled on the basis of the predefined rule.

This modeling unit will be described later in detail.

The information input/output device 340 includes an input device which receives information which is input from a user, and an output device which provides necessary information to the user. The output device may be a display portion which displays display information. For example, the information input/output device 340 is formed of a touch panel in which the input device is integrally formed with the display.

<Example of Production Apparatus 100>

Figure 2:
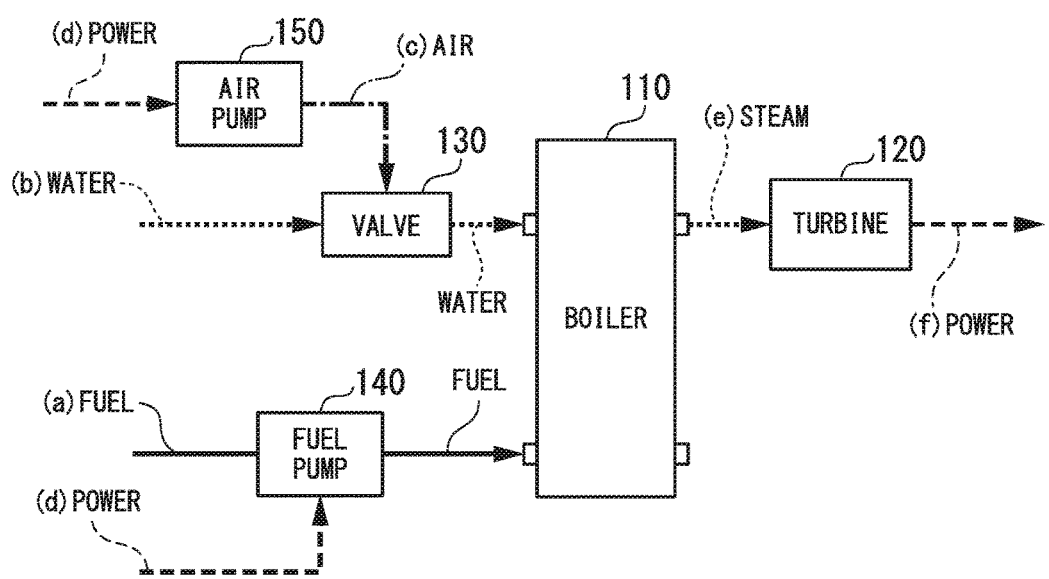
FIG. 2 is a configuration diagram showing a schematic configuration of an example of a production apparatus of the present invention.

FIG. 2 is a configuration diagram showing a schematic configuration of an example of the production apparatus 100.

Herein, with reference to FIG. 2, a thermal power generation apparatus 100A will be described as an example of the production apparatus 100 which is a management target of the energy management system 1.

The thermal power generation apparatus 100A generates power by rotating a turbine 120 with steam generated by a boiler 110, and the boiler 110 converts water (b) which is supplied via a valve 130 into steam (e) using heat obtained by combusting a fuel (a) which is supplied via a fuel pump 140. The fuel pump 140 is operated by power (d). The valve 130 is operated by air pressure (air (c)) supplied from an air pump 150 which is operated by the power (d).

Figure 3:
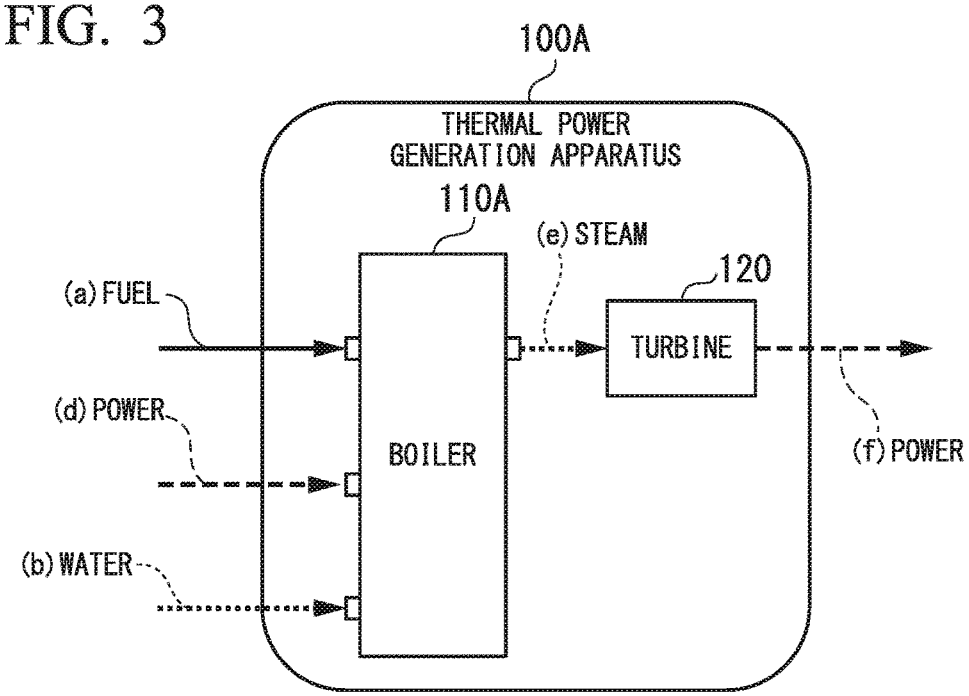
FIG. 3 is a configuration diagram showing another configuration example of the production apparatus of the present invention.

The valve 130, the fuel pump 140, the air pump 150 may be included in the boiler 110 as a part thereof. In this case, if a configuration of the boiler 110 including the valve 130, the fuel pump 140, and the air pump 150 is set as a boiler 110A, a configuration of the thermal power generation apparatus 100A may be simply represented as a configuration of including the turbine 120 and the boiler 110A as shown in FIG. 3. In this case, a fuel (a), power (d), and water (b) are input to the boiler 110A, and steam (e) is output from the boiler 110A. The steam (e) is input to the turbine 120, and power (f) is output from the turbine 120. If the thermal power generation apparatus 100A is considered as a single configuration, the fuel (a), the power (d), and the water (b) are input to the thermal power generation apparatus 100A, and the power (f) is output from the thermal power generation apparatus 100A. The steam (e) is regarded as transmission and reception of energy inside the thermal power generation apparatus 100A, and is not observed from the outside.

<Operation of Processes in Energy Management System 1>

Figure 4:
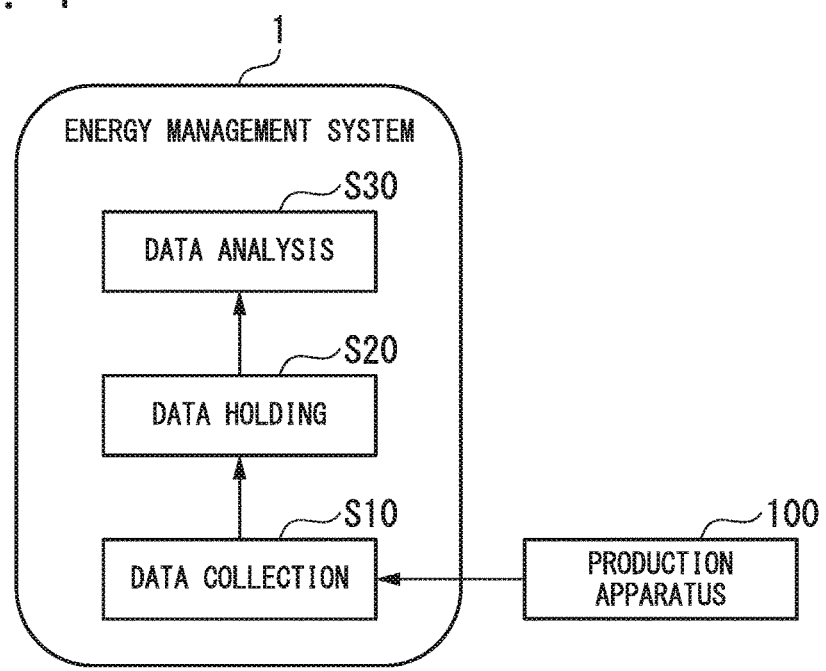
FIG. 4 is a flowchart showing a flow of processes in the energy management system according to the embodiment of the present invention.

FIG. 4 is a flowchart showing a flow of processes in the energy management system 1 according to the present embodiment.

First, the communicator 310 of the information processing apparatus 300 collects data (information) regarding energy efficiency of the production apparatus 100 detected by the sensor group 200, from the sensor group 200 via the communication network 5 (step S10: data collection).

When the thermal power generation apparatus 100A shown in FIG. 3 is exemplified, the information regarding energy efficiency of the production apparatus 100 is, for example, information regarding a fuel, power, and water which are input to the thermal power generation apparatus 100A, information regarding power output from the thermal power generation apparatus 100A, and information regarding steam causing energy consumption inside the thermal power generation apparatus 100A. The information regarding a fuel which is input to the thermal power generation apparatus 100A includes a heat quantity per unit fuel amount and an amount of supplied fuels. The information regarding power which is input to the thermal power generation apparatus 100A includes an amount of power used in the fuel pump 140 or a control device. The information regarding water which is input to the thermal power generation apparatus 100A includes the temperature of water and an amount of supplied water. It is necessary to appropriately control the ratio between the amount of supplied fuels and the amount of water in the energy management system 1. There is a case where the necessary amount of supplied fuels changes depending on the heat quantity of the fuel, or there is a case where the necessary heating amount changes depending on the temperature of water. Thus, the sensor group 200 collects various information pieces as the information which is input to the thermal power generation apparatus 100A. The information regarding power output from the thermal power generation apparatus 100A includes an amount (W) of generated power. The information regarding steam causing energy consumption inside the thermal power generation apparatus 100A includes the temperature and pressure of steam, and the flow rate of steam supplied to the turbine 120.

Next, the information storage 320 stores the data (information) regarding energy efficiency of the production apparatus 100 acquired by the communicator 310 (step S20: data holding). The central information processor 330 reads the data (information) regarding energy efficiency of the production apparatus 100 collected by the communicator 310 from the information storage 320, and performs at least one of monitoring, simulation, and optimization of energy efficiency in production activity performed by the production apparatus 100 on the basis of the read data (step S30: data analysis). The central information processor 330 uses a modeling unit in which information regarding a structure, a function, and performance related to energy efficiency of a constituent element of the production apparatus 100 is modeled on the basis of a predefined rule.

<Description of Modeling Unit>

Next, a description will be made of a modeling unit in which data (information) regarding energy efficiency of a constituent element forming the production apparatus 100 is modeled on the basis of a predefined rule.

Figure 5:
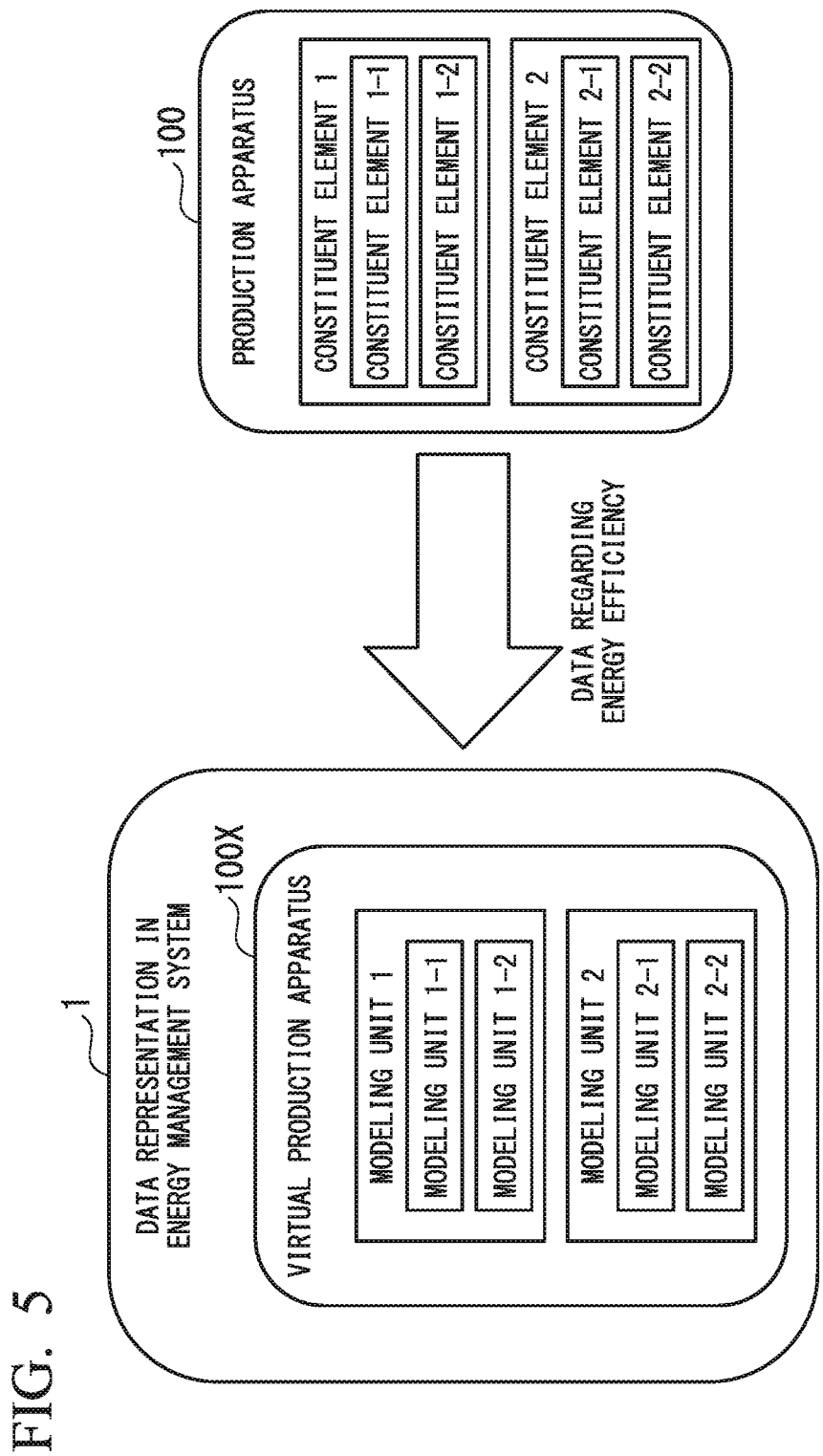
FIG. 5 is a schematic diagram showing an image in a case where constituent elements of the production apparatus of the present invention are represented by modeling units.

FIG. 5 is a schematic diagram showing an image in a case where the constituent elements of the production apparatus 100 are represented by modeling units. Most of such production apparatuses 100 are formed of various kinds of constituent elements having complex structures and delivered from a plurality of manufacturers. The energy management system 1 models the constituent elements hierarchically, and represents data regarding energy efficiency hierarchically for each modeling unit obtained through modeling.

For example, as shown in FIG. 5, it is assumed that the production apparatus 100 includes a constituent element 1 and a constituent element 2, the constituent element 1 further includes a constituent element 1-1 and a constituent element 1-2, and the constituent element 2 further includes a constituent element 2-1 and a constituent element 2-2. In the energy management system 1 according to the present embodiment, the production apparatus 100 is represented as a virtual production apparatus (virtual production apparatus 100X) using a modeling unit in which data regarding energy efficiency of each constituent element of the production apparatus is modeled on the basis of a predefined rule. Herein, the virtual production apparatus 100X includes a modeling unit 1 and a modeling unit 2, the modeling unit 1 further includes a modeling unit 1-1 and a modeling unit 1-2, and the modeling unit 2 further includes a modeling unit 2-1 and a modeling unit 2-2. As mentioned above, in the energy management system 1, data regarding energy efficiency of each constituent element of the production apparatus 100 is represented hierarchically using the modeling unit. Consequently, the energy management system 1 can perform at least one of monitoring, simulation, and optimization of energy efficiency so as to cope with a complex and diverse production apparatuses 100.

Constituent elements to be modeled may be some of the constituent elements forming the production apparatus 100, and may be all of the constituent elements. For example, among the constituent elements forming the production apparatus 100, a specific constituent element may be modeled.

Next, a configuration example of a modeling unit will be described.

(First Example of Modeling Unit)

FIG. 6 is a diagram showing a first example of a configuration of a modeling unit.

A modeling unit 500a shown in FIG. 6 is a basic configuration example of a modeling unit according to the present embodiment. The modeling unit 500a includes an input device 510 in which a portion which is input to the production apparatus 100 is modeled, an output device 520 in which a portion output from the production apparatus 100 is modeled, and a consumption portion 530 in which a portion consumed between input to and output from the production apparatus 100 is modeled. The portion consumed between input to and output from the production apparatus 100 includes a portion output from the production apparatus 100 due to consumption from input to the production apparatus 100 and output therefrom. For example, this consumption attribute may be an attribute related to a portion which is not used effectively and is consumed between input to and output from the modeling unit 500a.

In other words, in the modeling unit 500a, the structure of the flow of the constituent elements of the production apparatus 100 is represented as the structure of the flow from the input device 510 to the output device 520 or the consumption portion 530.

The modeling unit 500a includes an input attribute related to input to the modeling unit 500a so as to correspond to the input device 510. The modeling unit 500a includes an output attribute related to output from the modeling unit 500a so as to correspond to the output device 520. The modeling unit 500a includes a consumption attribute related to consumption between input to and output from the modeling unit 500a so as to correspond to the consumption portion 530. The input attribute, the output attribute, and the consumption attribute are attributes indicating features or states of the modeling unit 500a, and are defined on the basis of a function or performance of the constituent element of the production apparatus 100.

As mentioned above, the constituent elements of the production apparatus 100 may be represented as the modeling unit 500a in which the constituent elements are modeled using the structure of the flow from the input device 510 to the output device 520 or the consumption portion 530, and the input attribute, the output attribute, and the consumption attribute.

The attributes included in the modeling unit 500a includes information in which information indicating the type of flow is associated with information indicating the amount of flow for each type of flow of a target which is input to the modeling unit 500a.

FIG. 7 is a diagram showing an example of information included in the attributes of the modeling unit 500a. As shown in FIG. 7, each of the input attribute, the output attribute, and the consumption attribute includes information in which information indicating the type of flow is associated with information indicating the amount of flow.

The attributes of the modeling unit 500a may include information indicating the amount of flow per unit time as the information indicating the amount of flow.

FIG. 8 is a diagram showing an example of the information indicating the amount of flow included in the attributes of the modeling unit 500a. As shown in FIG. 8, the information indicating an amount of flow associates information ("time period-1", "time period-2", "time period-3", . . . ) indicating a time period with information ("flow rate-1", "flow rate-2", "flow rate-3", . . . ) indicating the amount of flow for each time period, and maintains the flow rate for each time period (unit time).

Consequently, the energy management system 1 can handle a temporal change of a flow rate, and can thus model a constituent element of the production apparatus 100 by taking into consideration the temporal change of the flow rate.

In addition, the information regarding a structure and a function related to energy efficiency of a constituent element of the production apparatus 100 used during modeling includes, for example, information indicating a structure in which water is supplied to the boiler 110 via the valve 130 and a fuel is supplied thereto via the fuel pump 140, or information indicating a structure in which the turbine 120 is driven by steam supplied from the boiler 110. The information regarding performance related to energy efficiency of a constituent element of the production apparatus 100 includes, for example, information indicating a relationship between the flow rate of a fuel supplied from the fuel pump 140 and the power required to supply the flow rate, and information indicating the relationship between the amount of steam supplied to the turbine 120 and the amount of power generated thereby.

(Second Example of Modeling Unit)

Figure 9:
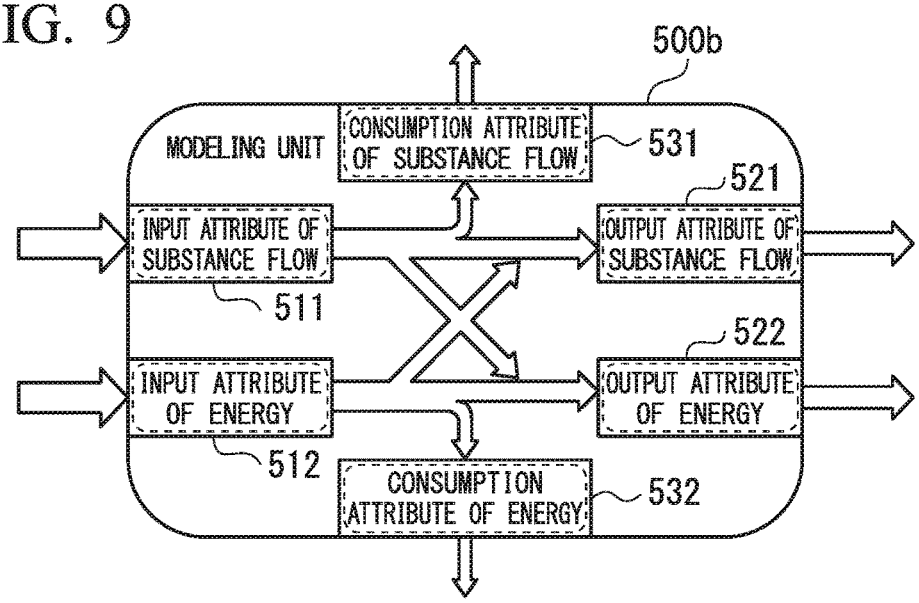
FIG. 9 is a diagram showing a second example of a configuration of a modeling unit of the present invention.

FIG. 9 is a diagram showing a second example of a configuration of a modeling unit.

A modeling unit 500b shown in FIG. 9 shows an example in which a substance flow and an energy flow of the production apparatus 100 are modeled using the configuration of the modeling unit 500a shown in FIG. 6. The modeling unit 500b includes an input device 511, an output device 521, and a consumption portion 531 regarding the substance flow, and an input device 512, an output device 522, and a consumption portion 532 regarding the energy flow.

The modeling unit 500b includes, as an attribute group related to the substance flow, an input attribute of the substance flow, an output attribute of the substance flow, and a consumption attribute of the substance flow, respectively corresponding to the input device 511, the output device 521, and the consumption portion 531 regarding the substance flow. The modeling unit 500b includes, as an attribute group related to the energy flow, an input attribute of the energy, an output attribute of the energy, and a consumption attribute of the energy, respectively corresponding to the input device 512, the output device 522, and the consumption portion 532 regarding the energy flow.

As mentioned above, the substance flow and the energy flow of the production apparatus 100 can be represented as models. The modeling unit 500b may include not only a flow from the input device 511 regarding the substance flow to the output device 521 or the consumption portion 531 and a flow from the input device 512 regarding the energy to the output device 522 or the consumption portion 532, but also a flow from the input device 511 regarding the substance flow to the output device 522 or the consumption portion 532 regarding the energy, or a flow from the input device 512 regarding related to the energy to the output device 521 or the consumption portion 531 regarding the substance flow.

The attributes of the modeling unit 500b include information in which the information indicating the type of flow described with reference to FIG. 7 or 8 is associated with information indicating an amount of flow for each set of a substance and energy as targets which are input to the modeling unit 500b. For example, each of the input attribute of the substance flow, the output attribute of the substance flow, and the consumption attribute of the substance flow includes information in which information indicating the type of substance flow is associated with information indicating the amount of the substance flow. Each of the input attribute of the energy, the output attribute of the energy, and the consumption attribute of the energy includes information in which information indicating the type of energy flow is associated with information indicating the amount of the energy flow.

For example, as the type of energy flow, there is electrical energy, thermal energy, potential energy, or kinetic energy. For example, in a case where a target which is input to the modeling unit 500b is energy, the attributes related to the energy flow of the modeling unit 500b include information indicating electrical energy, thermal energy, potential energy, or kinetic energy as the information indicating the type of energy flow.

(Third Example of Modeling Unit)

Figure 10:
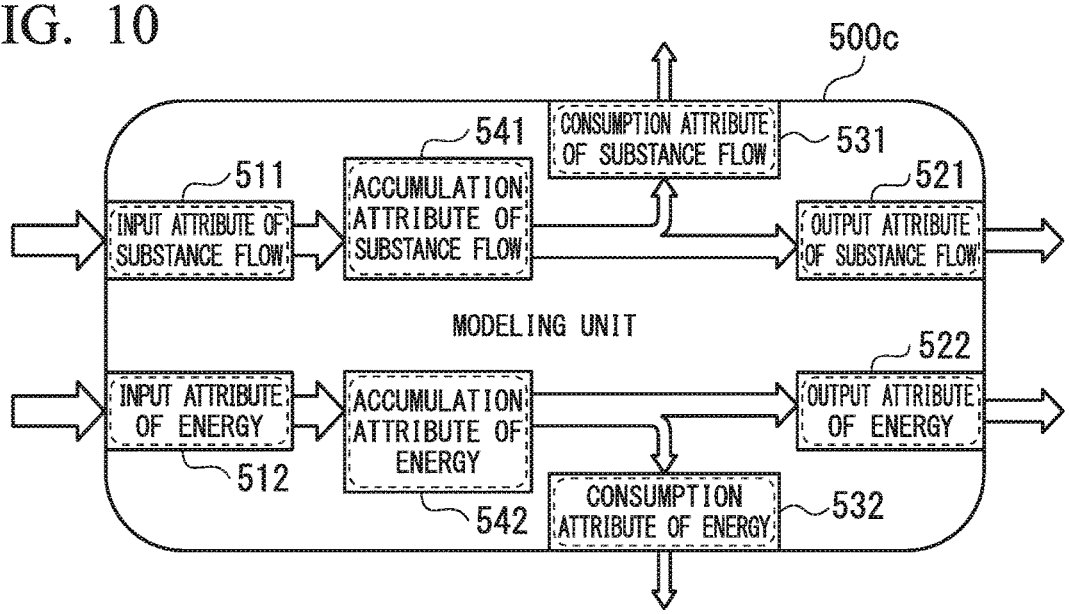
FIG. 10 is a diagram showing a third example of a configuration of a modeling unit of the present invention.

FIG. 10 is a diagram showing a third example of a configuration of a modeling unit.

A modeling unit 500c shown in FIG. 10 is different from the modeling unit 500b shown in FIG. 9 in that an accumulated portion in which a difference (in other words, a portion accumulated in the production apparatus 100) between input to the production apparatus 100 and output from the production apparatus 100 is modeled is further provided. For example, the modeling unit 500c includes an input device 511, an output device 521, a consumption portion 531, and an accumulated portion 541 regarding a substance flow, and an input device 512, an output device 522, a consumption portion 532, and an accumulated portion 542 regarding an energy flow.

The modeling unit 500c includes, as an attribute group related to the substance flow, an input attribute of the substance flow, an output attribute of the substance flow, a consumption attribute of the substance flow, and an accumulation attribute of the substance flow corresponding to the accumulated portion 541 regarding the substance flow.

For example, the accumulation attribute of the substance flow includes information indicating an accumulation amount of substances representing a difference between an inflow amount of substances which are input to the modeling unit 500c and an outflow amount of substances which are output from the modeling unit 500c. The inflow amount of substances is an amount of substances which are input to the input device 511 regarding the substance flow. The outflow amount of substances is an amount of substances which are output from the output device 521 and the consumption portion 531 regarding the substance flow.

The modeling unit 500*c* includes, as an attribute group related to the energy flow, an input attribute of the energy, an output attribute of the energy, a consumption attribute of the energy, and an accumulation attribute of the energy corresponding to the accumulated portion 542 regarding the energy flow.

The accumulation attribute of the energy includes information indicating an accumulation amount of energy representing a difference between an inflow amount of energy which is input to the modeling unit 500*c* and an outflow amount of energy which is output from the modeling unit 500*c*. The inflow amount of energy is an amount of energy which is input to the input device 512 regarding the energy flow. The outflow amount of energy is an amount of energy which is output from the output device 522 and the consumption portion 532 regarding the energy flow.

As mentioned above, the substance flow and the energy flow of the production apparatus 100 can also be modeled by taking into consideration accumulation of a substance and accumulation of energy in the production apparatus 100.

(Fourth Example of Modeling Unit)

Figure 11:
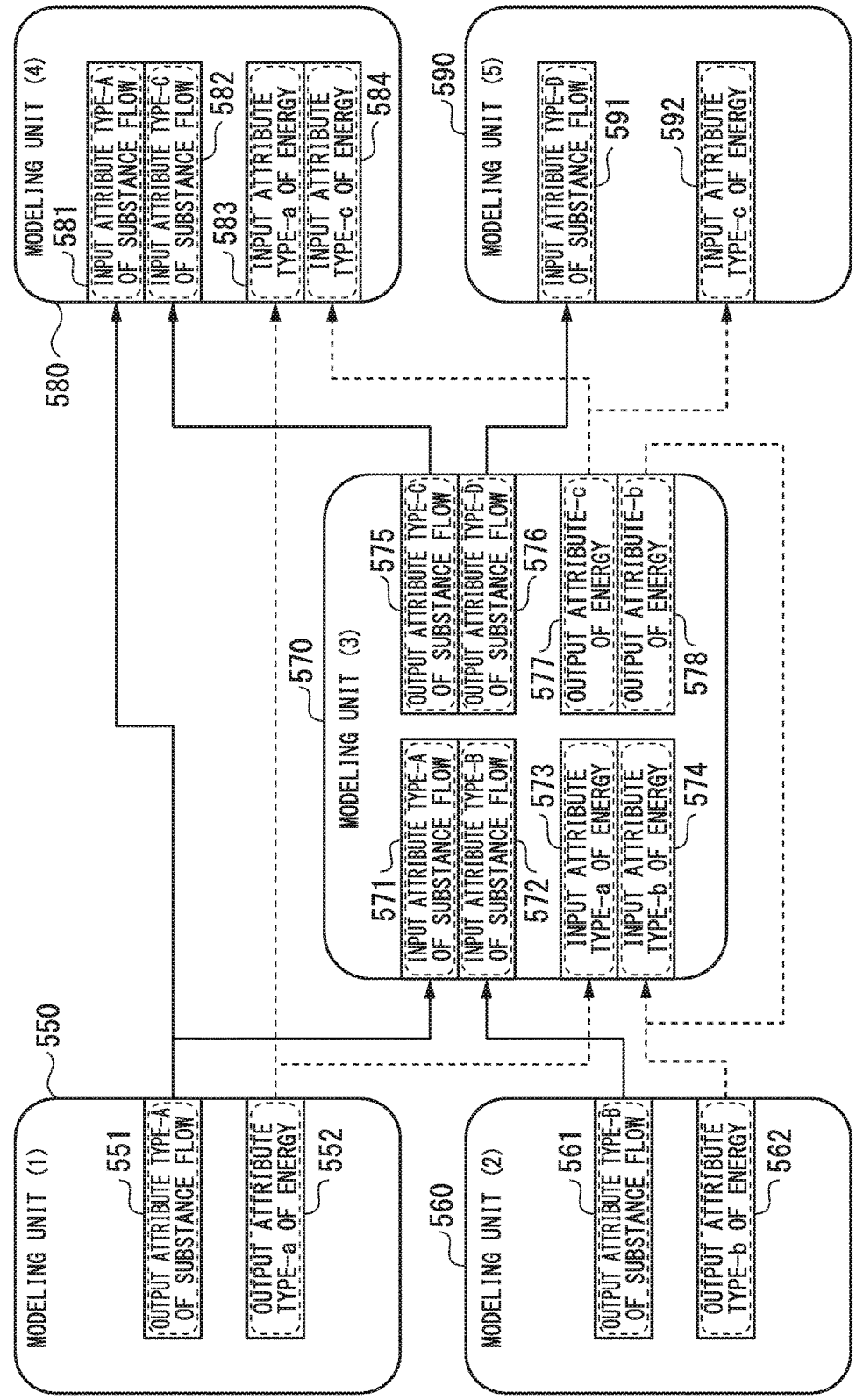
FIG. 11 is a diagram showing a fourth example of a configuration of a modeling unit of the present invention.

FIG. 11 is a diagram showing a fourth example of a configuration of a modeling unit.

FIG. 11 shows an example in which the production apparatus 100 is modeled using a plurality of combined modeling units. Here, FIG. 11 shows an example of a modeling unit group in which a modeling unit (1) 550, a modeling unit (2) 560, a modeling unit (3) 570, a modeling unit (4) 580, and a modeling unit (5) 590 are combined with each other. Each modeling unit includes at least an input device and an output device. FIG. 11 shows input devices and output devices which are connected between the respective modeling units, and does not show other input devices, output devices, and consumption components.

An output device 551 of the modeling unit (1) 550 is connected to an input device 571 of the modeling unit (3) 570 and an input device 581 of the modeling unit (4) 580. The output device 551 is correlated with an output attribute related to a substance flow of the modeling unit (1) 550, and the input device 571 and the input device 581 are respectively correlated with input attributes related to substance flows of the modeling units. The output attribute of the output device 551, the input attribute of the input device 571, and the input attribute of the input device 581 include information indicating the same type of substance flow (here, "type-A").

An output device 552 of the modeling unit (1) 550 is connected to an input device 573 of the modeling unit (3) 570 and an input device 583 of the modeling unit (4) 580. The output device 552 is correlated with an output attribute relating to an energy flow of the modeling unit (1) 550, and the input device 573 and the input device 583 are respectively correlated with input attributes related to energy flows of the modeling units. The output attribute of the output device 552, the input attribute of the input device 573, and the input attribute of the input device 583 include information indicating the same type of energy flow (here, "type-a").

An output device 561 of the modeling unit (2) 560 is connected to an input device 572 of the modeling unit (3) 570. The output device 561 is correlated with an output attribute related to a substance flow of the modeling unit (2) 560, and the input device 572 is correlated with an input attribute related to a substance flow of the modeling unit (3) 570. The output attribute of the output device 561 and the input attribute of the input device 572 include information indicating the same type of substance flow (here, "type-B").

An output device 562 of the modeling unit (2) 560 and an output device 578 of the modeling unit (3) 570 are connected to an input device 574 of the modeling unit (3) 570. The output device 562 is correlated with an output attribute related to an energy flow of the modeling unit (2) 560. The output device 578 of the modeling unit (3) 570 is correlated with an output attribute related to an energy flow of the modeling unit (3) 570, and the input device 574 is correlated with an input attribute related to an energy flow of the modeling unit (3) 570. The output attribute of the output device 562, the output attribute of the output device 578, and the input attribute of the input device 574 include information indicating the same type of energy flow (here, "type-b").

An output device 575 of the modeling unit (3) 570 is connected to an input device 582 of the modeling unit (4) 580. The output device 575 is correlated with an output attribute related to a substance flow of the modeling unit (3) 570, and the input device 582 is correlated with an input attribute related to a substance flow of the modeling unit (4) 580. The output attribute of the output device 575 and the input attribute of the input device 582 include information indicating the same type of substance flow (here, "type-C").

An output device 576 of the modeling unit (3) 570 is connected to an input device 591 of the modeling unit (5) 590. The output device 576 is correlated with an output attribute related to a substance flow of the modeling unit (3) 570, and the input device 591 is correlated with an input attribute related to a substance flow of the modeling unit (5) 590. The output attribute of the output device 576 and the input attribute of the input device 591 include information indicating the same type of substance flow (here, "type-D").

An output device 577 of the modeling unit (3) 570 is connected to an input device 584 of the modeling unit (4) 580 and an input device 592 of the modeling unit (5) 590. The output device 577 is correlated with an output attribute related to an energy flow of the modeling unit (3) 570, and the input device 584 and the input device 592 are respectively correlated with input attributes related to energy flows of the modeling units. The output attribute of the output device 577, the input attribute of the input device 584, and the input attribute of the input device 592 include information indicating the same type of energy flow (here, "type-c").

As mentioned above, in the fourth example of an modeling unit, a plurality of modeling units are combined with each other by connecting an output device of a certain modeling unit (first modeling unit) to an input device of another modeling unit (second modeling unit) having an input attribute including the same type of flow as that of an output attribute of the output device. Consequently, the substance flow and the energy flow of the production apparatus 100 can be represented as models using the plurality of combined modeling units.

The central information processor 330 can perform at least one of monitoring, simulation, and optimization of energy efficiency in production activity performed by the production apparatus 100, on the basis of the collected information regarding energy efficiency using the plurality of combined modeling units.

(Fifth Example of Modeling Unit)

Figure 12:
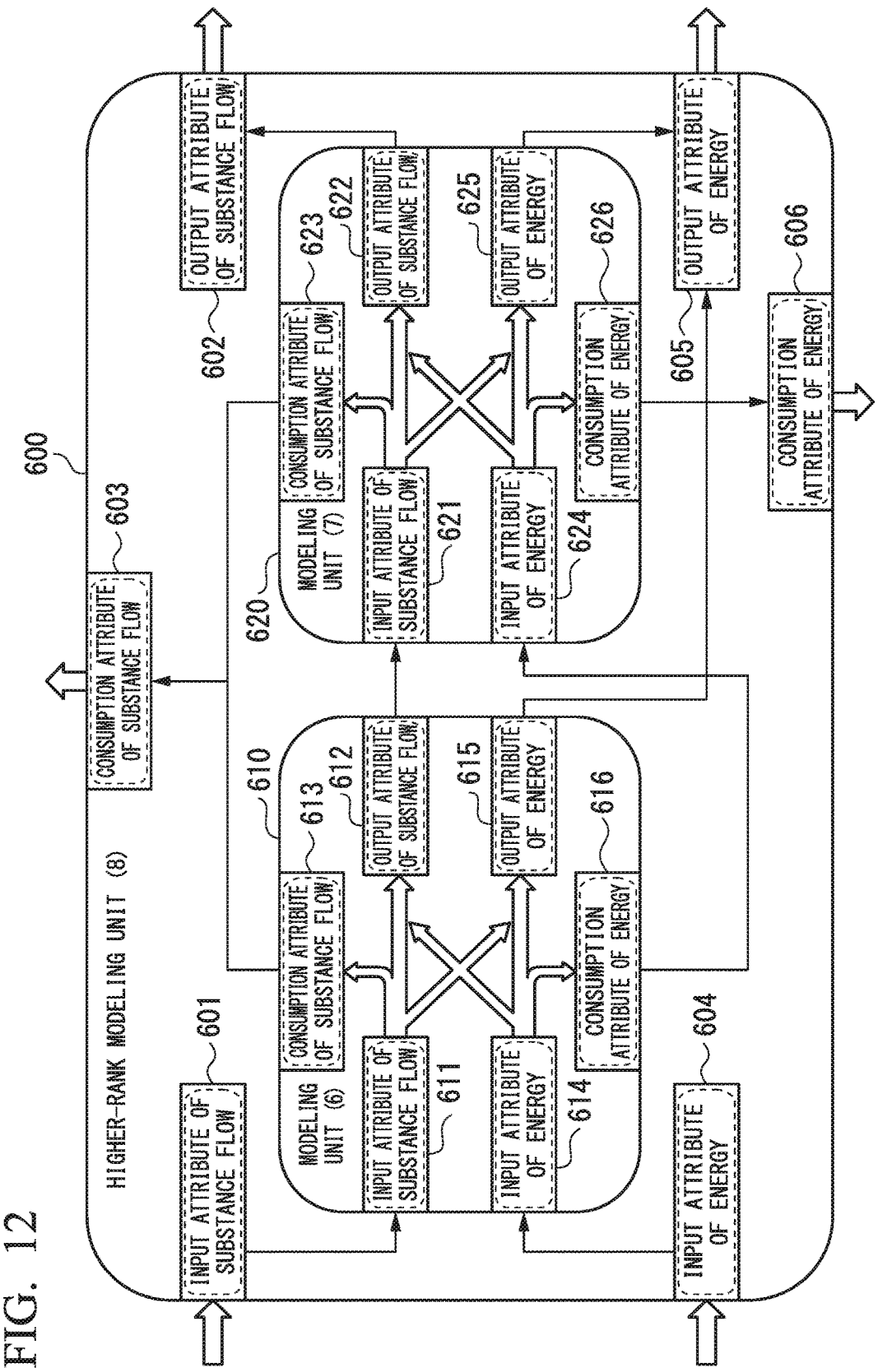
FIG. 12 is a diagram showing a fifth example of a configuration of a modeling unit of the present invention.

FIG. 12 is a diagram showing a fifth example of a configuration of a modeling unit.

FIG. 12 shows an example in which the production apparatus 100 is modeled using hierarchical modeling units. Here, FIG. 12 shows an example in which a modeling unit (6) 610 and a modeling unit (7) 620 which are combined with each other are collectively represented as a higher-rank modeling unit (8) 600.

The modeling unit (6) 610 and the modeling unit (7) 620 correspond to, for example, the modeling unit 500b shown in FIG. 9. An input device 611, an output device 612, and a consumption component 613 regarding a substance flow of the modeling unit (6) 610, and an input device 621, an output device 622, and a consumption component 623 regarding a substance flow of the modeling unit (7) 620 respectively correspond to the input device 511, the output device 521, and the consumption portion 531 regarding a substance flow of the modeling unit 500b shown in FIG. 9. An input device 614, an output device 615, and a consumption component 616 regarding an energy flow of the modeling unit (6) 610, and an input device 624, an output device 625, and a consumption component 626 regarding a substance flow of the modeling unit (7) 620 respectively correspond to the input device 512, the output device 522, and the consumption portion 532 regarding an energy flow of the modeling unit 500b shown in FIG. 9.

The modeling unit (6) 610 and the modeling unit (7) 620 are, for example, combined modeling units in which the output device and the input device having a flow of the same type are connected to each other in the same manner as in the fourth example described with reference to FIG. 11.

Here, with respect to a substance flow, the output device 612 of the modeling unit (6) 610 is connected to the input device 621 of the modeling unit (7) 620. With respect to an energy flow, the consumption component 616 of the modeling unit (6) 610 is connected to the input device 624 of the modeling unit (7) 620.

An input device, an output device, and a consumption component which are not connected between the plurality of combined modeling units in the higher-rank modeling unit (8) 600 are connected to an input device, an output device, or a consumption component of the higher-rank modeling unit (8) 600. Respectively corresponding input attribute, output attribute, and consumption attribute of the input device, the output device, and the consumption component of the higher-rank modeling unit (8) 600 are used as an input attribute, an output attribute, and a consumption attribute corresponding to an input device, an output device, and a consumption component which are respectively connected thereto.

In the example shown in FIG. 12, the input device 611 and the consumption component 613 regarding the substance flow and the input device 614 and the output device 615 regarding the energy flow of the modeling unit (6) 610 are connected to the modeling unit (7) 620, and are connected to any one of the input device, the output device, and the consumption component of the higher-rank modeling unit (8) 600. The output device 622 and the consumption component 623 regarding the substance flow and the output device 625 and the consumption component 626 regarding the energy flow of the modeling unit (7) 620 are not connected to the modeling unit (6) 610, and are connected to any one of the input device, the output device, and the consumption component of the higher-rank modeling unit (8) 600.

Specifically, the input device 611 regarding the substance flow of the modeling unit (6) 610 is connected to an input device 601 of the higher-rank modeling unit (8) 600. An input attribute corresponding to the input device 601 of the higher-rank modeling unit (8) 600 is an input attribute related to the substance flow corresponding to the input device 611 of the modeling unit (6) 610.

The input device 614 regarding the energy flow of the modeling unit (6) 610 is connected to an input device 604 of the higher-rank modeling unit (8) 600. An input attribute corresponding to the input device 604 of the higher-rank modeling unit (8) 600 is an input attribute related to the substance flow corresponding to the input device 614 of the modeling unit (6) 610.

The output device 622 regarding the substance flow of the modeling unit (7) 620 is connected to an output device 602 of the higher-rank modeling unit (8) 600. An output attribute corresponding to the output device 602 of the higher-rank modeling unit (8) 600 is an output attribute related to the substance flow corresponding to the output device 622 of the modeling unit (7) 620.

The consumption component 626 regarding the energy flow of the modeling unit (7) 620 is connected to a consumption component 606 of the higher-rank modeling unit (8) 600. A consumption attribute corresponding to the consumption component 606 of the higher-rank modeling unit (8) 600 is a consumption attribute related to the energy flow corresponding to the consumption component 626 of the modeling unit (7) 620.

In a case where there a plurality of input devices, a plurality of output devices, or a plurality of consumption components which are not connected between the plurality of combined modeling units in the higher-rank modeling unit (8) 600, attributes respectively corresponding to the plurality of input devices, the plurality of output devices, or the plurality of consumption components are collected and are used as attributes of the higher-rank modeling unit (8) 600.

In the example shown in FIG. 12, the consumption component 613 regarding the substance flow of the modeling unit (6) 610 and the consumption component 623 regarding the substance flow of the modeling unit (7) 620 are connected to the consumption component 603 of the higher-rank modeling unit (8) 600. A consumption attribute corresponding to the consumption component 603 of the higher-rank modeling unit (8) 600 is obtained by collecting a consumption attribute related to a substance flow corresponding to the consumption component 613 and a consumption attribute related to a substance flow corresponding to the consumption component 623.

The output device 615 regarding the energy flow of the modeling unit (6) 610 and the output device 625 regarding the energy flow of the modeling unit (7) 620 are connected to the output device 605 of the higher-rank modeling unit (8) 600. An output attribute corresponding to the output device 605 of the higher-rank modeling unit (8) 600 is obtained by collecting an output attribute related to an energy flow corresponding to the output device 615 and an output attribute related to a substance flow corresponding to the output device 625.

As mentioned above, in the fifth example of a modeling unit, the substance flow and the energy flow of the production apparatus 100 can be represented as models using the hierarchical modeling units. Therefore, the production apparatus 100 which is formed of various kinds of constituent elements having considerably complex structures can be modeled hierarchically.

The central information processor 330 can perform at least one of monitoring, simulation, and optimization of energy efficiency in production activity performed by the production apparatus 100, on the basis of the collected information regarding energy efficiency using a plurality of hierarchical combined modeling units.

(Sixth Example of Modeling Unit)

If a target which is input to a modeling unit is a substance, an attribute related to a substance flow of the modeling unit may include information regarding unit apparent energy indicating energy per unit amount corresponding to the type of the substance.

Figure 13:
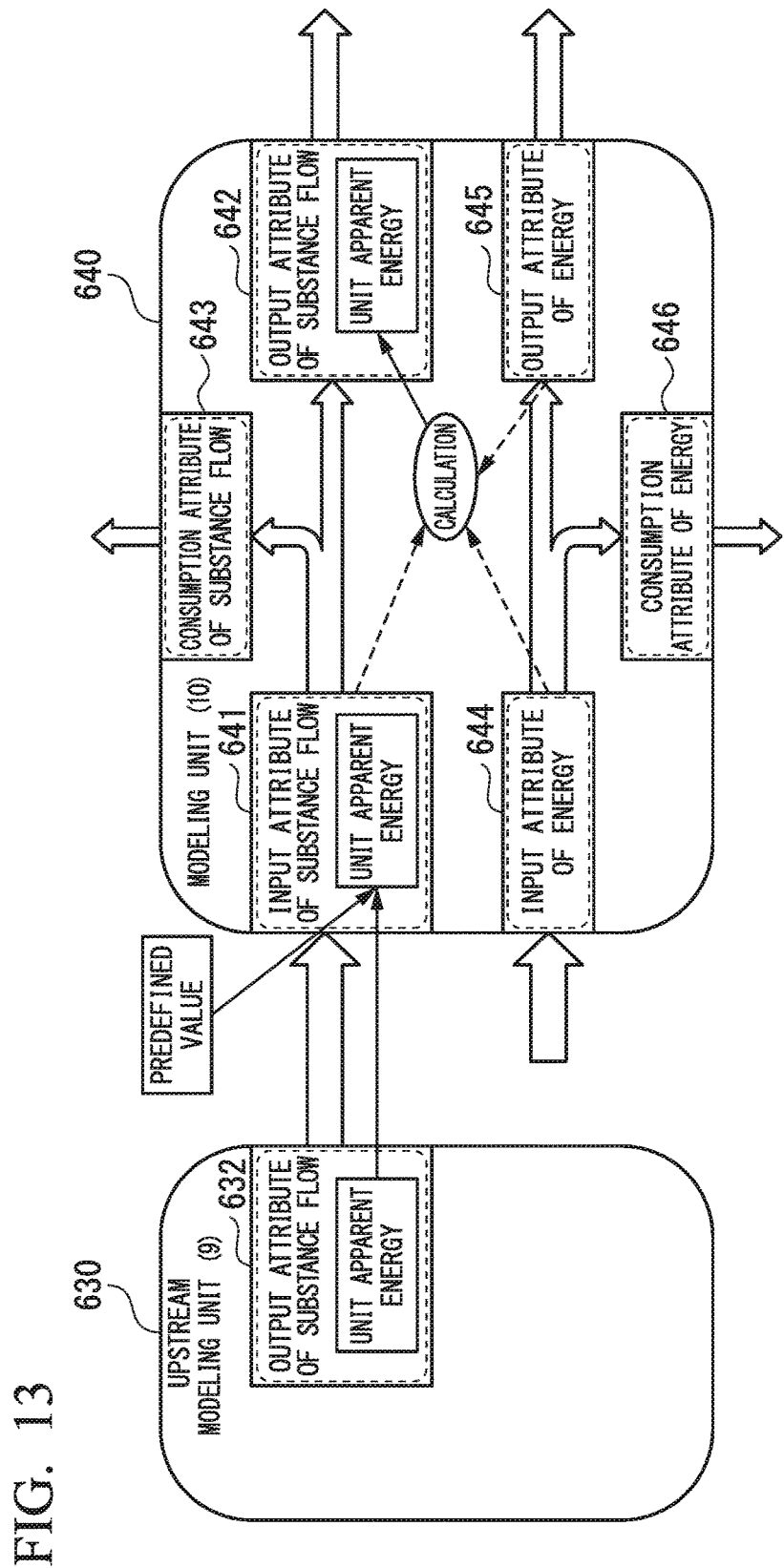
FIG. 13 is a diagram showing a sixth example of a configuration of a modeling unit of the present invention.

FIG. 13 is a diagram showing a sixth example of a configuration of a modeling unit. FIG. 13 shows an example of including a plurality of combined modeling units in the same manner as in the above-described fourth example or fifth example. As shown in FIG. 13, a modeling unit (9) 630 and a modeling unit (10) 640 are combined with each other, and the modeling unit (9) 630 is a modeling unit on an upstream side of the modeling unit (10) 640. For example, the modeling unit (9) 630 corresponds to the modeling unit (6) 610 shown in FIG. 12, but only the output device 632 regarding a substance flow is shown, and the remaining input device, output devices, and consumption components are not shown. The modeling unit (10) 640 corresponds to the modeling unit (7) 620 shown in FIG. 12, and includes an input device 641, an output device 642, and a consumption component 643 related to a substance flow, and an input device 644, an output device 645, and a consumption component 646 regarding an energy flow.

The output device 632 of the modeling unit (9) 630 is connected to the input device 641 of the modeling unit (10) 640.

Here, unit apparent energy included in an input attribute related to a substance flow corresponding to the input device 641 of the modeling unit (10) 640 is used as a value of unit apparent energy included in an output attribute related to a substance flow corresponding to the output device 632 of the modeling unit (9) 630 connected on the upstream side. The unit apparent energy included in an input attribute related to a substance flow corresponding to the input device 641 of the modeling unit (10) 640 may be a predefined value of unit apparent energy.

The central information processor 330 calculates a value of unit apparent energy included in an output attribute related to a substance flow corresponding to the output device 642 of the modeling unit (10) 640 on the basis of the input attribute related to a substance flow corresponding to the input device 641 of the modeling unit (10) 640, an input attribute related to an energy flow corresponding to the input device 644, and an output attribute related to an energy flow corresponding to the output device 645.

For example, the central information processor 330 calculates a value of unit apparent energy included in the output attribute related to a substance flow corresponding to the output device 642 of the modeling unit (10) 640 using the following Equation 1.

$$e_{MOUT} = (E_{IN} - E_{OUT} + e_{MIN} \times f_{MIN})/f_{MOUT} \quad \text{(Equation 1)}$$

where:
$E_{IN}$: Input energy;
$E_{OUT}$: Output energy;
$e_{MIN}$: Input unit apparent energy;
$e_{MOUT}$: Output unit apparent energy;
$f_{MIN}$: Input substance flow amount; and
$f_{MOUT}$: Output substance flow amount.

In a case where the modeling unit (10) 640 includes output devices corresponding to a plurality of output attributes related to a substance flow, the central information processor 330 may use a value obtained by distributing a total of unit apparent energy in the modeling unit (10) 640 in proportion to an outflow amount of substance flow in each of the plurality of output attributes, as a value of unit apparent energy included in each of the plurality of output attributes. The total of unit apparent energy in the modeling unit (10) 640 is a value of unit apparent energy included in an output attribute related to of the entire modeling unit (10) 640, calculated according to the above Equation 1.

(Seventh Example of Modeling Unit)

Figure 14:
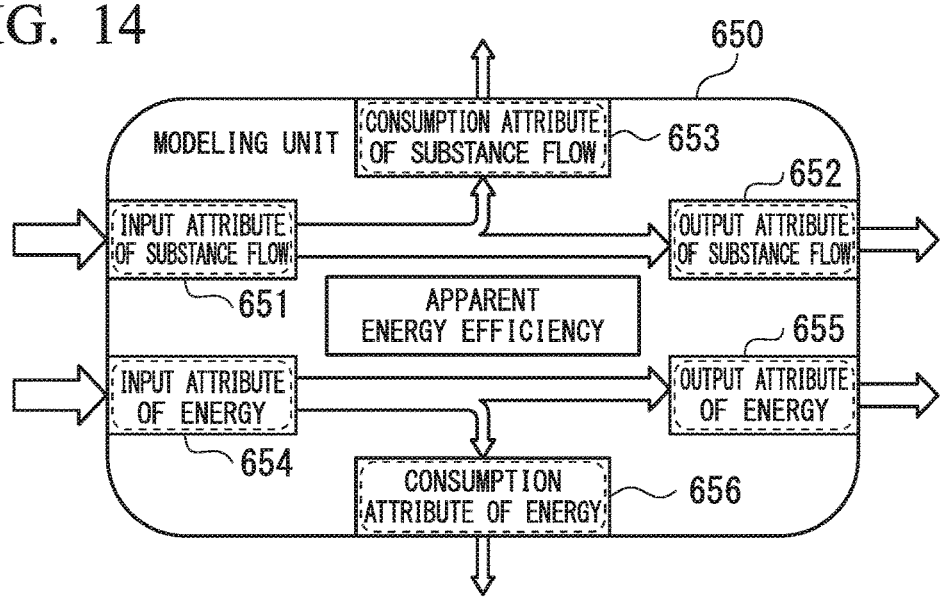
FIG. 14 is a diagram showing a seventh example of a configuration of a modeling unit of the present invention.

FIG. 14 is a diagram showing a seventh example of a configuration of a modeling unit.

A modeling unit 650 shown in FIG. 14 corresponds to, for example, the modeling unit 500b shown in FIG. 9. The modeling unit 650 includes an input device 651, an output device 652, and a consumption component 653 regarding a substance flow, and an input device 654, an output device 655, and a consumption component 656 regarding an energy flow. In the seventh example, regarding an attribute of the modeling unit 650, the modeling unit 650 includes apparent energy efficiency calculated from another attribute thereof as an attribute.

For example, the central information processor 330 calculates the apparent energy efficiency using the following Equation 2.

$$EE = (E_{OUT} + e_{MOUT} \times f_{MOUT})/(E_{IN} + e_{MIN} \times f_{MIN}) \quad \text{(Equation 2)}$$

where:
EE: Apparent energy efficiency;
$E_{IN}$: Input energy;
$E_{OUT}$: Output energy;
$e_{MIN}$: Input unit apparent energy;
$e_{MOUT}$: Output unit apparent energy;
$f_{MIN}$: Input substance flow amount; and
$f_{MOUT}$: Output substance flow amount.

(Eighth Example of Modeling Unit)

Figure 15:
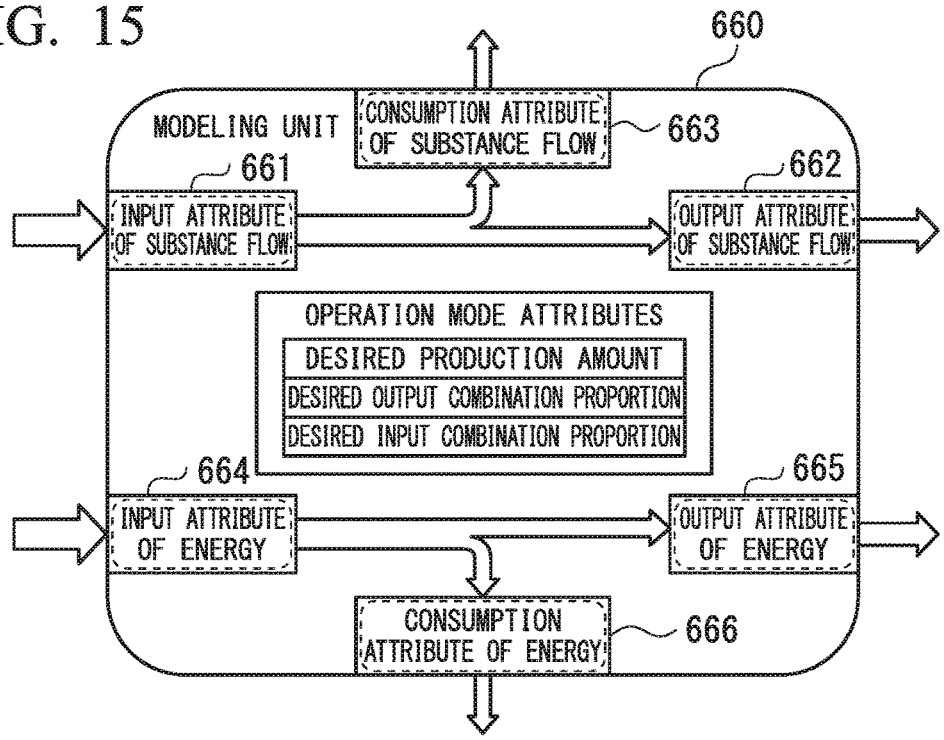
FIG. 15 is a diagram showing an eighth example of a configuration of a modeling unit of the present invention.

FIG. 15 is a diagram showing an eighth example of a configuration of a modeling unit.

A modeling unit 660 shown in FIG. 15 corresponds to, for example, the modeling unit 500b shown in FIG. 9. The modeling unit 660 includes an input device 661, an output device 662, and a consumption component 663 regarding a substance flow, and an input device 664, an output device 665, and a consumption component 666 regarding an energy flow. In the eighth example, the modeling unit 660 includes an attribute (operation mode attribute) including at least one of pieces of information regarding a desired production amount indicating a desired value of an outflow amount of a target which is output from the modeling unit 660, a desired output combination proportion indicating a desired proportion of an outflow amount for each type of target which is output from the modeling unit 660, and a desired input combination proportion indicating a desired proportion for each type of target which is input to the modeling unit 660. As mentioned above, since the modeling unit 660 includes the operation mode attribute, and thus power consumption can be reduced by controlling an operation mode of a production facility, such as adjustment of a desired production amount or transition to a pause state, it is possible to improve energy efficiency.

EXAMPLES OF USE

Next, examples of use of the energy management system 1 according to the present embodiment will be described.

(Usage Example 1) Simulation for Optimization Design of Plant and Automation System Thereof As one of the means in which an effect of improving energy efficiency during operation of the production apparatus 100 (plant) is great, the plant and an automation system are designed to achieve the maximum energy efficiency prior to construction of the plant. Simulation using a virtual plant model is performed for optimization design of energy efficiency. Most of such plants are formed of various kinds of elements having complex structures and delivered from a plurality of manufacturers.

The energy management system 1 can model hierarchically various kinds of constituent elements having complex structures, and can thus represent energy related data for each portion hierarchically. For example, the energy management system 1 models the production apparatus 100 using a modeling unit (for example, refer to the first example or the second example of the modeling unit shown in FIG. 6 or 9), and also models the production apparatus 100 using a plurality of combined modeling units (for example, refer to the fourth example of a modeling unit shown in FIG. 11), or a modeling unit in which a plurality of combined modeling units are hierarchically modeled as a higher-rank modeling unit (for example, refer to the fifth example of a modeling unit shown in FIG. 12).

The modeling unit includes an input attribute, an output attribute, and a consumption attribute (for example, refer to the first example of a modeling unit shown in FIG. 6). For example, the modeling unit includes an attribute group related to a substance flow and an attribute group relating to an energy flow (for example, refer to the second example of a modeling unit shown in FIG. 9). Each attribute includes information indicating the type of flow and information indicating an amount of flow (for example, refer to FIGS. 7 and 8), and is formed for each type of flow (for example, refer to the fourth example of a modeling unit shown in FIG. 11). Consequently, energy related data can be represented in a unified manner even for different kinds of constituent elements from a plurality of manufacturers.

For example, in a case of the thermal power generation apparatus 100A shown in FIG. 2, assuming that a specific condition (for example, the temperature of water) of the thermal power generation apparatus 100A is set to a constant value, the amount of fuel or the amount of input power required to obtain expected output power can be computed on the basis of performance characteristics of a constituent element (for example, the boiler 110 or the turbine 120) of the apparatus. Energy efficiency for each output power amount can be calculated (by using, for example, Equation 2) on the basis of a relationship between each of a plurality of output power amounts and the necessary amount of fuel or the amount of input power respectively corresponding thereto, and thus an operation condition causing the maximum energy efficiency can be determined. Selection or design of a constituent element of the thermal power generation apparatus 100A is replaced, and simulation based on the same computation is performed, so that a configuration or design of the thermal power generation apparatus 100A appropriate for an expected output power amount can be determined.

As mentioned above, the energy management system 1 performs modeling by hierarchically combining modeling units having general structures such as an input attribute, an output attribute, and a consumption attribute, and thus includes a high degree of freedom when hierarchically modeling various constituent elements of the production apparatus 100. Therefore, the energy management system 1 can perform flexible simulation so as to cope with a complex and diverse production apparatuses 100 (plants) using the modeling method with a high degree of freedom.

(Usage Example 2) Optimal Procurement in Plant Construction for Realizing High Energy Efficiency During Operation of Plant When constituent elements of the production apparatus 100 (plant) are procured, constituent elements which include the same function but different energy consumption characteristics may be selected. In this case, the energy management system 1 of the present embodiment represents characteristics of options of respective constituent elements based on modeling units in a unified manner using an input attribute, an output attribute, and a consumption attribute, and information indicating the type of flow and information indicating the amount of flow included in each attribute (for example, refer to FIGS. 6, 7, 8, 9 and 11), and can thus easily compare the characteristics with each other or perform simulation using the information.

For example, when a specific machine type of a specific constituent element (for example, the fuel pump 140) of the thermal power generation apparatus 100A shown in FIG. 2 is selected, if performance of the entire thermal power generation apparatus is computed for each condition using performance (for example, a characteristic of a necessary power amount corresponding to a fuel supply amount) of each of machine types of candidate fuel pumps, and is compared for each machine type of the candidate fuel pumps, it is possible to select a machine type capable of realizing optimal performance.

For example, if product information from a plurality of manufacturers is supplied so as to be unified to a representation method of characteristics of a constituent element used in a modeling unit, it is possible to more efficiently perform plant design or procurement maximizing energy efficiency. Such information is provided by electronic means, and thus an information processing technique is more easily used.

(Usage Example 3) Check of Effect of Energy Efficiency Improvement Measures During Test Run of Plant and Operation of Plant In a production process in the production apparatus 100 (plant), a raw material or a material is converted into a product by direct energy such as power or heat, or, conversely, thermal energy or electrical energy is generated through combustion of a raw material or a chemical reaction of a raw material. Thus, in order to measure and monitor energy efficiency, it is necessary to understand both of a substance flow and an energy flow along with conversion therebetween. The energy management system 1 according to the present embodiment can understand the balance of energy in a wider range so as to treat a substance flow and an energy flow in a unified manner (for example, refer to the second example of a modeling unit shown in FIG. 9).

In a case where optimization of energy efficiency is examined, it is necessary not only to monitor energy efficiency of the entire production system of hierarchical modeling units but also to specify a location to be improved by recognizing low level energy efficiency or check an improvement effect. Energy efficiency of the production system may be generally represented by a ratio between a value obtained through a production process and energy used to generate the value. However, a generated value differs for each production process, and thus it may not be easy to perform comparison using an index of energy efficiency common to a plurality of different production processes.

The energy management system 1 according to the present embodiment can convert a raw material into energy using unit apparent energy delivered from an output attribute of a modeling unit in an upstream step to an input attribute of a modeling unit in a downstream step with respect to an attribute related to a substance flow (raw material), and can evaluate energy efficiency with an energy ratio (for example, refer to the sixth example of a modeling unit shown in FIG. 13). Consequently, it is possible to apply a common index of energy efficiency to a plurality of different modeling units and thus to compare energy efficiency between modeling units or compare effects of improvement measures with each other.

(Usage Example 4) Simulation for Optimization of Energy Efficiency Improvement Measures During Test Run of Plant and Operation of Plant In a production process of the production apparatus 100 (plant), generally, time delay occurs from input of a raw material to the process to the appearance of energy as output. In order to model an energy flow and a substance flow in such a process, delay due to the time delay is required to be represented as an accumulation element. In order to maximize energy efficiency of each step, there is a case where an operation schedule between a plurality of step is adjusted, or the plurality of step is synchronized with each other. In this case, it is necessary to represent a function of a tank or a store accumulating substances such as a raw material or a function of a battery or a heat storage accumulating energy as an accumulation element in order to model the function.

The energy management system 1 according to the present embodiment can model or the production apparatus 100 in which the above-described delay due to the time delay occurs or which includes an accumulation function so as to represent accumulation elements of a substance and energy as attributes of a modeling unit (for example, refer to the third example of a modeling unit shown in FIG. 10), and can thus perform advanced simulation of optimization of energy efficiency using the modeled production apparatus.

As one of methods of improving energy efficiency, there is a method of reusing energy or a raw material which is wastefully consumed in a production process. It is also important to model and simulate such improvement of energy efficiency.

The energy management system 1 according to the present embodiment can model reuse of the energy and the raw material using a plurality of modeling units which are combined with each other by connecting an consumption component of a certain modeling unit to an input device of another modeling unit (for example, refer to the fourth example of a modeling unit shown in FIG. 11). The energy management system 1 can model and treat the reuse without treating the reused raw material or energy as a consumption attribute in a higher-rank modeling unit according to the example in which a plurality of combined modeling units are collected and are treated as the higher-rank modeling unit (for example, refer to the fifth example of a modeling unit shown in FIG. 12).

As another method of improving energy efficiency, there is a method of reducing energy consumption by controlling an operation mode of a production facility, such as adjustment of a desired production amount or transition to a pause state. The energy management system 1 according to the present embodiment gives an operation mode attribute to a modeling unit (for example, refer to the eighth example of a modeling unit shown in FIG. 15), and can thus perform simulation of optimization of energy efficiency through control of the operation mode.

As mentioned above, several embodiments of the present invention have been described in detail with reference to the drawings, but a specific configuration is not limited to the above-described embodiments, and includes design within the scope without departing from the spirit of the invention. For example, the respective functions described in the embodiments may be optionally combined with each other.

The functions of some or all of the respective sections of the information processing apparatus 300 in the above-described embodiments may be realized by a computer. For example, the energy management system 1 according to the above-described embodiment may be a computer based energy management system realizing a function including at least one of monitoring, simulation, and optimization of energy efficiency in production activity. In this case, a program for realizing the above-described functions may be recorded on a computer readable recorder, and the above-described functions may be realized by a computer system reading the program recorded on the recorder and executing the program. The "computer system" mentioned here is a computer system built into the information processing apparatus 300, and is assumed to include an OS or hardware such as peripheral devices.

The "computer system" is assumed to include a home page providing environment (or display environment) as long as a WWW system is used.

The "computer readable recorder" indicates a portable medium such as a flexible disc, a magneto-optical disc, a ROM, or a CD-ROM, and a storage such as a hard disk built into the computer system. The "computer readable recorder" may include a medium which holds dynamically for a short period of time, such as a communication line in a case where the program is transmitted via a network such as the Internet or a communication line such as a telephone channel, and a medium which holds the program for a predetermined period of time, such as a nonvolatile memory inside the computer system which serves as a server or a client in that case. The program may realize some of the above-described functions, and may realize the above-described functions in combination with a program which includes already been recorded in the computer system.

A part or the whole of the information processing apparatus 300 in the above-described embodiment may be realized as an integrated circuit such as a large scale integration (LSI) circuit. The respective functional blocks of the information processing apparatus 300 may be separately generated as a processor, and some or all of the functional blocks may be integrated into a processor. A technique for an integrated circuit is not limited to LSI, and may be realized by a dedicated circuit or a general purpose processor. In addition, in a case where a technique for an integrated circuit replacing the LSI circuit will appear with the advance of a semiconductor technique, an integrated circuit based on the technique may be used.

DESCRIPTION OF REFERENCE NUMERALS

1 ENERGY MANAGEMENT SYSTEM
5 COMMUNICATION NETWORK
100 PRODUCTION APPARATUS
100A THERMAL POWER GENERATION APPARATUS

110 AND
110A BOILER
120 TURBINE
130 VALVE
140 FUEL PUMP
150 AIR PUMP
200 SENSOR GROUP
300 INFORMATION PROCESSING APPARATUS
310 COMMUNICATOR
320 INFORMATION STORAGE
330 CENTRAL INFORMATION PROCESSOR
340 INFORMATION INPUT/OUTPUT DEVICE
500, 500a, 500b, 500c, 550, 560, 570, 580, 590, 600, 610, 620, 630, 640, 650, AND
660 MODELING UNIT

The invention claimed is:

1. An energy management system comprising:
a collector configured to collect information regarding energy efficiency of a production apparatus; and
a processor configured to perform at least one of monitoring, simulation, and optimization of energy efficiency in production activity performed by the production apparatus, on the basis of the information regarding energy efficiency collected by the collector, using a plurality of modeling units in which information regarding energy efficiency of constituent elements of the production apparatus are modeled on the basis of a predefined rule,
wherein each modeling unit comprises: an input component obtained by modeling a portion which is input to the production apparatus; an output component obtained by modeling a portion which is output from the production apparatus; and a consumption component obtained by modeling a component consumed between input to and output from the production apparatus,
wherein each modeling unit comprises, as attributes indicating a feature or a state of the modeling unit, an input attribute relating to input to the modeling unit, an output attribute related to output from the modeling unit, and a consumption attribute related to consumption between input to and output from the modeling unit,
wherein each of the attributes of the modeling unit includes information in which type information indicating a type of flow is associated with amount information indicating an amount of the flow for the type of flow of a target which is input to the modeling unit,
wherein the plurality of modeling units are combined with each other by connecting the output component of a first modeling unit to the input component of a second modeling unit having the input attribute including the same type of the flow as a type of the flow of the output attribute of the output component of the first modeling unit,
wherein the plurality of combined modeling units are collected into a single modeling unit as a higher-rank modeling unit, and the higher-rank modeling unit including an input component, an output component, and a consumption component,
wherein an input component, an output component, and a consumption component which are not used in connection between the plurality of combined modeling units in the higher-rank modeling unit are respectively connected to the input component, the output component, and the consumption component of the higher-rank modeling unit, and
wherein the input attribute, the output attribute, and the consumption attribute respectively corresponding to the input component, the output component, the consumption component connected to the input component, the output component and the consumption component of the higher-rank modeling unit are respectively used as the input attribute, the output attribute, and the consumption attribute respectively corresponding to the input component, the output component, the consumption component of the higher-rank modeling unit.

2. The energy management system according to claim 1, wherein, in a case where there are a plurality of input components, a plurality of output components or a plurality of consumption components which are not used in connection between the plurality of combined modeling units in the higher-rank modeling unit, attributes respectively corresponding to the plurality of input components, the plurality of output components, or the plurality of consumption components, are collected and are used as the corresponding attribute of the higher-rank modeling unit.

3. An energy management system comprising:
a collector configured to collect information regarding energy efficiency of a production apparatus; and
a processor configured to perform at least one of monitoring, simulation, and optimization of energy efficiency in production activity performed by the production apparatus, on the basis of the information regarding energy efficiency collected by the collector, using a plurality of modeling units in which information regarding energy efficiency of constituent elements of the production apparatus are modeled on the basis of a predefined rule,
wherein each modeling unit comprises: an input component obtained by modeling a portion which is input to the production apparatus; an output component obtained by modeling a portion which is output from the production apparatus; and a consumption component obtained by modeling a component consumed between input to and output from the production apparatus,
wherein each modeling unit comprises, as attributes indicating a feature or a state of the modeling unit, an input attribute relating to input to the modeling unit, an output attribute related to output from the modeling unit, and a consumption attribute related to consumption between input to and output from the modeling unit,
wherein each of the attributes of the modeling unit includes information in which type information indicating a type of flow is associated with amount information indicating an amount of the flow for the type of flow of a target which is input to the modeling unit,
wherein the plurality of modeling units are combined with each other by connecting the output component of a first modeling unit to the input component of a second modeling unit having the input attribute including the same type of the flow as a type of the flow of the output attribute of the output component of the first modeling unit,
wherein, in a case where a target which is input to a modeling unit of the plurality of modeling units is a substance, the attributes related to a substance flow of the modeling unit include information regarding unit apparent energy indicating an energy per unit amount corresponding to a type of the substance, and wherein the processor sets the unit apparent energy included in an input attribute related to a substance flow of the modeling unit to a value of the unit apparent energy included in an output attribute related to a substance flow of a modeling unit which is combined on an upstream side or to a predefined value of the unit apparent energy, and calculates a value of the unit apparent energy included in an output attribute related to a substance flow of the modeling unit on the basis of the input attribute related to a substance flow of the modeling unit, an input attribute related to an energy flow, and an output attribute related to an energy flow.

4. The energy management system according to claim 3, wherein the processor is configured to calculate the value of the unit apparent energy included in the output attribute based on the following expression:

$$e_{MOUT}=(E_{IN}-E_{OUT}+e_{MIN}\times f_{MIN})/f_{MOUT}$$

where:
$E_{IN}$ is an input energy;
$E_{OUT}$ is an output energy;
$e_{MIN}$ is an input unit apparent energy;
$e_{MOUT}$ is an output unit apparent energy;
$f_{MIN}$ is an input substance flow; and
$f_{MOUT}$ is an output substance flow.

5. The energy management system according to claim 4, wherein, in a case where a modeling unit of the plurality of modeling units has a plurality of output components which correspond to output attributes related to a plurality of substance flow, the processor is configured to define a value which is obtained by allocating a total unit apparatus energy included in the modeling unit in a proportion to an outflow amount in each of the plurality of the output attributes as the value of the unit apparent energy included in each of the plurality of output attributes.

6. The energy management system according to claim 5, wherein the attributes of each modeling unit have apparent energy efficiency calculated from the other attributes of the modeling unit as the attributes.

7. The energy management system according to claim 6, wherein the processor is configured to calculate the apparent energy efficiency based on the following expression:

$$EE=(E_{OUT}+e_{MOUT}\times f_{MOUT})/(E_{IN}+e_{MIN}\times f_{MIN})$$

where:
EE is an apparent energy efficiency;
$E_{IN}$ is an input energy;
$E_{OUT}$ is an output energy;
$e_{MIN}$ is an input unit apparent energy;
$e_{MOUT}$ is an output unit apparent energy;
$f_{MIN}$ is an input substance flow; and
$f_{MOUT}$ is an output substance flow.

* * * * *